(12) United States Patent
Huffman et al.

(10) Patent No.: US 6,195,301 B1
(45) Date of Patent: Feb. 27, 2001

(54) FEEDBACK DRIVER FOR MEMORY ARRAY BITLINE

(75) Inventors: James D. Huffman, Richardson; Rodney D. Miller, Frisco; Eric A. Schmidt, Garland, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/468,561

(22) Filed: Dec. 21, 1999

Related U.S. Application Data

(60) Provisional application No. 60/114,129, filed on Dec. 30, 1998.

(51) Int. Cl.$^7$ .................................................. G11C 7/00
(52) U.S. Cl. .............. 365/202; 365/189.03; 365/189.04; 365/206; 365/230.06
(58) Field of Search .................. 365/230.06, 189.03, 365/189.04, 206, 202

(56) References Cited

U.S. PATENT DOCUMENTS

| | | | |
|---|---|---|---|
| 5,278,652 | 1/1994 | Urbanus et al. ..................... | 358/160 |
| 5,411,769 | 5/1995 | Hornbeck .............................. | 427/534 |
| 5,583,688 | 12/1996 | Hornbeck .............................. | 359/291 |
| 6,038,193 | * 3/2000 | Wang et al. ..................... | 365/189.04 |

* cited by examiner

*Primary Examiner*—Amir Zarabian
*Assistant Examiner*—VanThu Nguyen
(74) *Attorney, Agent, or Firm*—Charles A. Brill; Wade James Brady, III; Frederick J. Telecky, Jr.

(57) ABSTRACT

An auxiliary line driver (514) able to sense data driven on a signal path (502) by a primary line driver (512), and then drive the data on the signal path (502). The auxiliary driver (514) allows a small primary line driver (512) to drive a large load, or a large number of loads (504, 506) without consuming a large area in the region where the primary line driver (512) is fabricated. The auxiliary line driver is particularly useful for driving the memory array of a micromirror device, especially during a block clear operation in which a large number of memory cells (506) are written to simultaneously. When the auxiliary line driver (514) receives an enable signal (518), the auxiliary line driver drives the last input provided to the input of the auxiliary line driver (514).

13 Claims, 6 Drawing Sheets

FEEDBACK DRIVER FOR MEMORY ARRAY BITLINE

This application claims priority under 35 USC §119(e)(1) of provisional application number 60/114,129 filed Dec. 30, 1998.

CROSS-REFERENCE TO RELATED APPLICATIONS

The following patents and/or commonly assigned patent applications are hereby incorporated herein by reference:

| U.S. Pat. No. | Filing Date | Issue Date | Title |
| --- | --- | --- | --- |
| 5,278,652 | March 23, 1993 | Jan. 11, 1994 | DMD Architecture and Timing for use in a Pulse-Width Modulated Display System |
| 5,411,769 | Sept. 29, 1993 | May 2, 1995 | Method of Producing Micromechanical Devices |
| 5,583,688 | Dec. 21, 1993 | Dec. 10, 1996 | Multi-Level Digital Micromirror Device |

FIELD OF THE INVENTION

This invention relates to the field of micromirror devices, more particularly to memory configurations suitable for use with micromirror devices, more particularly to circuits and methods for boosting the current drive capacity to enable simultaneous write operations to multiple rows of memory cells.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

A digital micromirror device (DMD™), sometimes referred to as deformable micromirror device, is a type of micromechanical device. Other types of micromechanical devices include accelerometers, pressure and flow sensors, gears and motors. While some micromechanical devices, such as pressure sensors, flow sensors, and DMDs have found commercial success, other types have not yet been commercially viable.

Digital micromirror devices are primarily used in optical display systems. In display systems, the DMD is a light modulator that uses digital image data to modulate a beam of light by selectively reflecting portions of the beam of light to a display screen. While analog modes of operation are possible, DMDs typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics were used to illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the DMD surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

At each instant, the light incident a DMD element is either reflected toward the image pixel, or is reflected away from the image pixel. Thus, the pixel associated with the DMD cell, that is the pixel created with light reflected by the DMD mirror, is either maximally illuminated ("on") or minimally illuminated ("off"). Intermediate intensities are created by pulse width modulating the mirror element over a frame time so that the duty cycle of the mirror element is proportional to the desired optical density of the pixel, as indicated by an image data word for the pixel.

Because the electrostatic operation of the DMD latches the mirror in place, binary data for one bit period is loaded into a memory cell addressing each mirror element during the prior bit display period. Unfortunately, the time required to load the entire array, or portion of the array, called the load period, can be longer than the display period of one or more of the LSBs. When this occurs, new data cannot be loaded during the previous display period, and a blanking period is required. A blanking period occurs when off data is loaded into the entire array, or a reset group of the array, and the mirrors in the reset group are turned off while data is loaded into the reset group. The data for the blanking period can be loaded into the array faster than actual image data because the memory cells for many rows of mirror array are loaded simultaneously.

Loading many rows of the memory cell array at the same time can require a large drive current for the bitline driver. Since the physical area in which the driver is located is very limited, it is difficult to provide a large current driver. Instead, past DMDs have relied on an extended write time to allow the bitline driver to overcome the capacitance of the many memory cells that it is attempting to drive. What is needed is a better system and method for driving the memory array bitline that will allow many rows of the mirror memory array simultaneously to be driven without extended write times.

Loading many rows of a memory cell array can cause a large peak current depending on the state of the memory cells. This peak current, coupled with the RC time constant of the bitline, can overpower the bitline driver and cause wrong data to be loaded into the memory cells. The five-transistor SRAM cell is especially susceptible to wrong data when loaded in this fashion. The bitline can be thought of as a distributed RC load. Therefore, memory cells located furthest from the bitline driver are most likely to be loaded with wrong data when multiple rows of memory cells are being loaded.

SUMMARY OF THE INVENTION

Objects and advantages will be obvious, and will in part appear hereinafter and will be accomplished by the present invention which provides a feedback driver especially adapted for driving a bitline in a memory array. According to one embodiment of the disclosed invention, a memory circuit is disclosed. The memory circuit comprises an array of memory cells, at least one bitline, at least one bitline driver, and at least one auxiliary bitline driver. The bitline is electrically connected to the bitline driver, auxiliary bitline driver, and at least one memory cell. The bitline driver is operable to drive a data signal on the bitline. The auxiliary bitline driver is able to sense the data signal and to drive the data signal on the bitline.

According to another embodiment of the disclosed invention a line driver circuit is provided. The line driver circuit comprises a load circuit, line driver, and auxiliary line driver electrically connected by a conductive signal path. The line driver is operable to drive a signal on the conductive signal path. The auxiliary line driver is able to sense the signal on the conductive signal path and to drive the signal on the conductive path.

According to yet another embodiment, a method of writing to a memory array is provided. The method comprising the steps of driving a data signal on a bitline, sensing the data signal at a location remote to the bitline driver, and driving the sensed data signal on the bitline with an auxiliary bitline driver.

According to still another embodiment of the disclosed invention, an image projection system is provided. The image projection system comprises a light source, an improved micromirror device, a controller, and a projection lens. The light source provides a beam of light that strikes the improved micromirror device. The improved micromirror device selectively reflects portions of the beam of light along either a first or second path in response to image signals from the controller. The improved micromirror device comprises a memory cell array and an array of mirrors. Each of the mirrors associated with at least one memory cell in the memory cell array. The memory cell array comprises an array of memory cells with at least one bitline, bitline driver, and an auxiliary bitline driver connected to at least one memory cell. The auxiliary bitline driver able to sense image data driven on the bitline by the bitline driver and to drive the image data on the bitline.

The disclosed auxiliary line driver enables a large load to be driven, especially a large distributed load, without requiring a large primary line driver. In the case of a typical micromirror device, the primary line driver is located in a region that is too small to allow a larger drive circuit. The auxiliary line driver is fabricated at the opposite end of the bitline from the primary driver, in a region where sufficient space is available. Since the auxiliary line driver senses the data on the bitline before driving the bitline, only a single enable signal must be routed around the memory array to enable a very large number of the auxiliary line drivers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
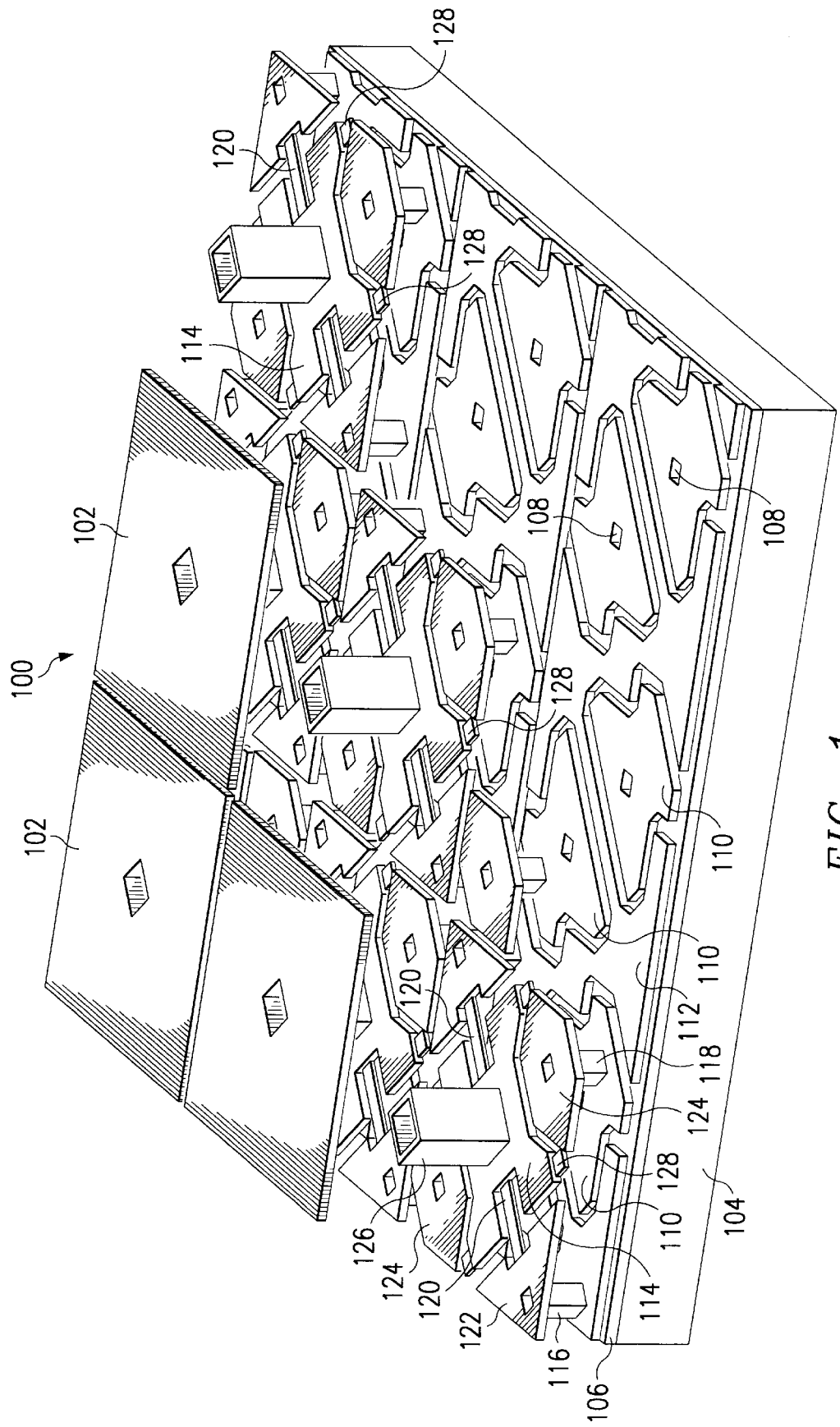
FIG. 1 is a perspective view of a small portion of a prior art digital micromirror array.
Figure 2:
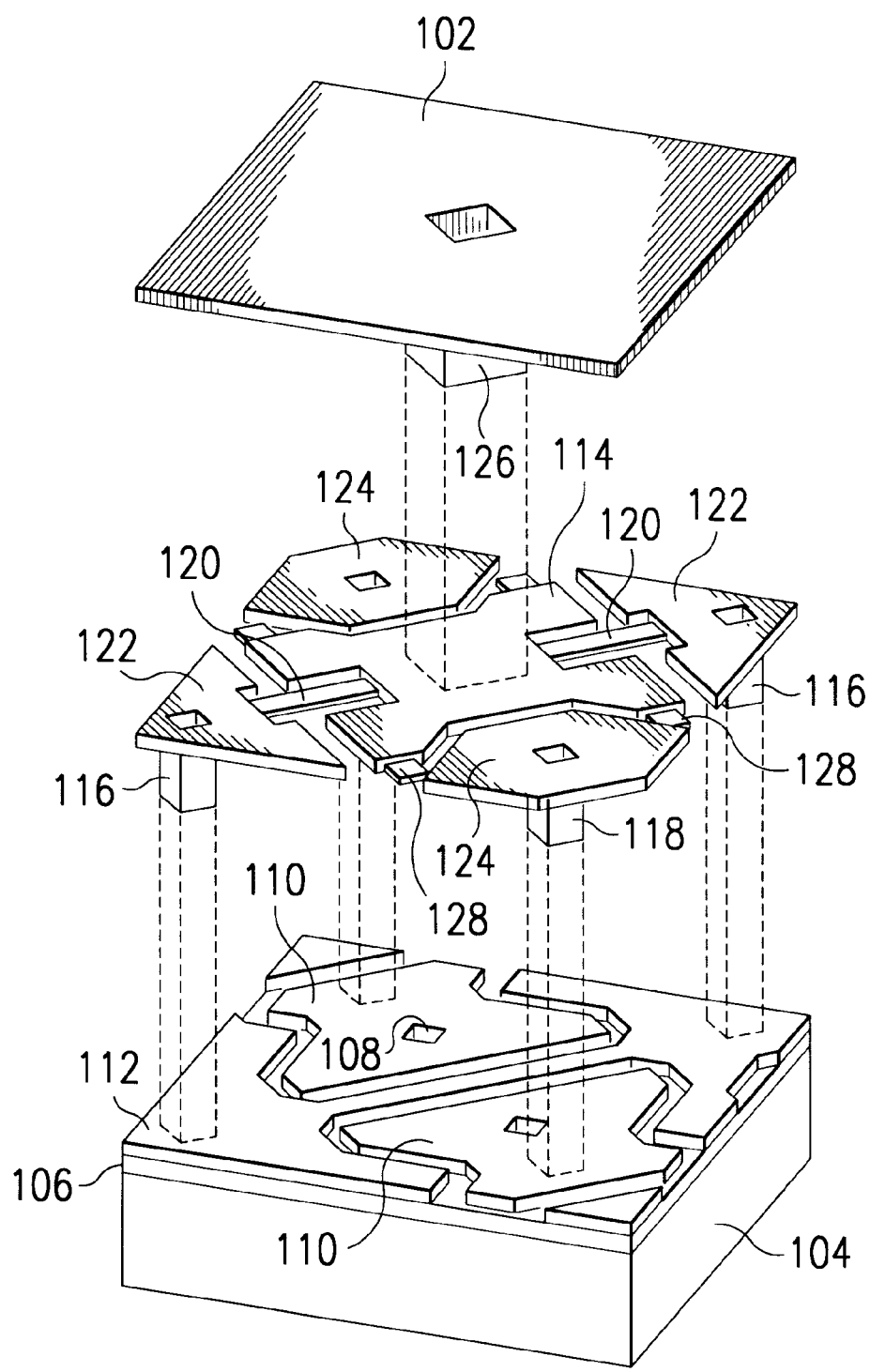
FIG. 2 is an exploded view of one element of the DMD array of FIG. 1.

A typical hidden-hinge DMD 100 is actually an orthogonal array of DMD cells, or elements. This array often includes more than a thousand DMD rows and columns of DMDs. FIG. 1 shows a small portion of a DMD array of the prior art with several mirrors 102 removed to show the underlying mechanical structure of the DMD array. FIG. 2 is an exploded view of a single DMD element of the prior art further detailing the relationships between the DMD structures.

A DMD is fabricated on a semiconductor, typically silicon, substrate 104. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells. Voltage driver circuits to drive bias and reset signals to the mirror superstructure may also be fabricated on the DMD substrate, or may be external to the DMD. Image processing and formatting logic is also formed in the substrate 104 of some designs. For the purposes of this disclosure, addressing circuitry is considered to include any circuitry, including direct voltage connections and shared memory cells, used to control the direction of rotation of a DMD mirror.

The silicon substrate 104 and any necessary metal interconnection layers are isolated from the DMD superstructure by an insulating layer 106 which is typically a deposited silicon dioxide layer on which the DMD superstructure is formed. Holes, or vias, are opened in the oxide layer to allow electrical connection of the DMD superstructure with the electronic circuitry formed in the substrate 104.

The first layer of the superstructure is a metalization layer, typically the third metalization layer and therefore often called M3. The first two metalization layers are typically required to interconnect the circuitry fabricated on the substrate. The third metalization layer is deposited on the insulating layer and patterned to form address electrodes 110 and a mirror bias connection 112. Some micromirror designs have landing electrodes which are separate and distinct structures but are electrically connects to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 116 or weld the mirror 102 to the address electrodes 110, in either case ruining the DMD.

Since the same voltage is always applied both to the landing electrodes and the mirrors 102, the mirror bias connection and the landing electrodes are preferably combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are often coated with a material chosen to reduce the tendency of the mirror 102 and torsion hinge yoke 114 to stick to the landing site.

Mirror bias/reset voltages travel to each mirror 102 through a combination of paths using both the mirror bias/reset metalization 112 and the mirrors and torsion beams of adjacent mirror elements. Split reset designs require the array of mirrors to be subdivided into multiple subarrays each having an independent mirror bias connection. The landing electrode/mirror bias 112 configuration shown in FIG. 1 is ideally suited to split reset applications since the DMD elements are easily segregated into electrically isolated rows or columns simply by isolating the mirror bias/reset layer between the subarrays. The mirror bias/reset layer of FIG. 1 is shown divided into rows of isolated elements.

A first layer of supports, typically called spacervias, is fabricated on the metal layer forming the address electrodes 110 and mirror bias connections 112. These spacervias, which include both hinge support spacervias 116 and upper address electrode spacervias 118, are typically formed by spinning a thin spacer layer over the address electrodes 110 and mirror bias connections 112. This thin spacer layer is typically a 1 $\mu$m thick layer of positive photoresist. After the photoresist layer is deposited, it is exposed, patterned, and deep UV hardened to form holes in which the spacervias will be formed. This spacer layer and a thicker spacer layer used later in the fabrication process are often called sacrificial layers since they are used only as forms during the fabrication process and are removed from the device prior to device operation.

A thin layer of metal is sputtered onto the spacer layer and into the holes. An oxide is then deposited over the thin metal layer and patterned to form an etch mask over the regions that later will form hinges 120. A thicker layer of metal, typically an aluminum alloy, is sputtered over the thin layer and oxide etch masks. Another layer of oxide is deposited and patterned to define the hinge yoke 114, hinge cap 122, and the upper address electrodes 124. After this second oxide layer is patterned, the two metals layers are etched simultaneously and the oxide etch stops removed to leave thick rigid hinge yokes 114, hinge caps 122, and upper address electrodes 124, and thin flexible torsion beams 120.

A thick spacer layer is then deposited over the thick metal layer and patterned to define holes in which mirror support spacervias 126 will be formed. The thick spacer layer is typically a 2 $\mu$m thick layer of positive photoresist. A layer of mirror metal, typically an aluminum alloy, is sputtered on the surface of the thick spacer layer and into the holes in the thick spacer layer. This metal layer is then patterned to form the mirrors 102 and both spacer layers are removed using a plasma etch.

Once the two spacer layers have been removed, the mirror is free to rotate about the axis formed by the torsion hinge. Electrostatic attraction between an address electrode 110 and a deflectable rigid member, which in effect form the two plates of an air gap capacitor, is used to rotate the mirror structure. Depending on the design of the micromirror device, the deflectable rigid member is the torsion beam yoke 114, the beam or mirror 102, a beam attached directly to the torsion hinges, or a combination thereof. The upper address electrodes 124 also electrostatically attract the deflectable rigid member.

The force created by the voltage potential is a function of the reciprocal of the distance between the two plates. As the rigid member rotates due to the electrostatic torque, the torsion beam hinges resist deformation with a restoring torque which is an approximately linear function of the angular deflection of the torsion beams. The structure rotates until the restoring torsion beam torque equals the electrostatic torque or until the rotation is mechanically blocked by contact between the rotating structure and a fixed component. As discussed below, most micromirror devices are operated in a digital mode wherein sufficiently large bias voltages are used to ensure full deflection of the micromirror superstructure.

Micromirror devices are generally operated in one of two modes of operation. The first mode of operation is an analog mode, sometimes called beam steering, wherein the address electrode is charged to a voltage corresponding to the desired deflection of the mirror. Light striking the micromirror device is reflected by the mirror at an angle determined by the deflection of the mirror. Depending on the voltage applied to the address electrode, the cone of light reflected by an individual mirror is directed to fall outside the aperture of a projection lens, partially within the aperture, or completely within the aperture of the lens. The reflected light is focused by the lens onto an image plane, with each individual mirror corresponding to a fixed location on the image plane. As the cone of reflected light is moved from completely within the aperture to completely outside the aperture, the image location corresponding to the mirror dims, creating continuous brightness levels.

The second mode of operation is a digital mode. When operated digitally, each micromirror is fully deflected in either of the two directions about the torsion beam axis. Digital operation uses a relatively large voltage to ensure the mirror is fully deflected. Since it is advantageous to drive the address electrode using standard logic voltage levels, a bias voltage, typically a negative voltage, is applied to the mirror metal layer to increase the voltage difference between the address electrodes and the mirrors. Use of a sufficiently large mirror bias voltage—a voltage above what is termed the collapse voltage of the device—ensures the mirror will deflect to the closest landing electrodes even in the absence of an address voltage. Therefore, by using a large mirror bias voltage, the address voltages need only be large enough to deflect the mirror slightly.

To create an image using the micromirror device, the light source is positioned at an angle equal to twice the angle of rotation so that mirrors rotated toward the light source reflect light in a direction normal to the surface of the micromirror device and into the aperture of a projection lens—creating a bright pixel on the image plane. Mirrors rotated away from the light source reflect light away from the projection lens—leaving the corresponding pixel dark. Intermediate brightness levels are created by pulse width modulation techniques in which the mirror is rapidly and repetitively rotated on and off The duty cycle of the mirror determines the quantity of light reaching the image plane. The human eye integrates the light pulses and the brain perceives a flicker-free intermediate brightness level.

Full-color images are generated by using three micromirror devices to produce three single-color images, or by sequentially forming three single-color images using a single micromirror device illuminated by a beam of light passing through three color filters mounted on a rotating color wheel.

Digital images require a lot of image data. For example, a 1024 by 768 pixel image requires 786,432 data words to create one monochromatic image. Assuming a system is capable of creating a full-color image having 30 bits of optical density data for each pixel in the image (10 bits per color), a single image requires 23,592,960 bits of image data. If the image data is a 72 Hz video stream, a 212.33 Mbytes/sec. transfer rate is required. The transfer rate increases even more if some of the MSBs are transferred to the DMD multiple times, as is done by some bit-splitting artifact reduction algorithms.

Figure 3:
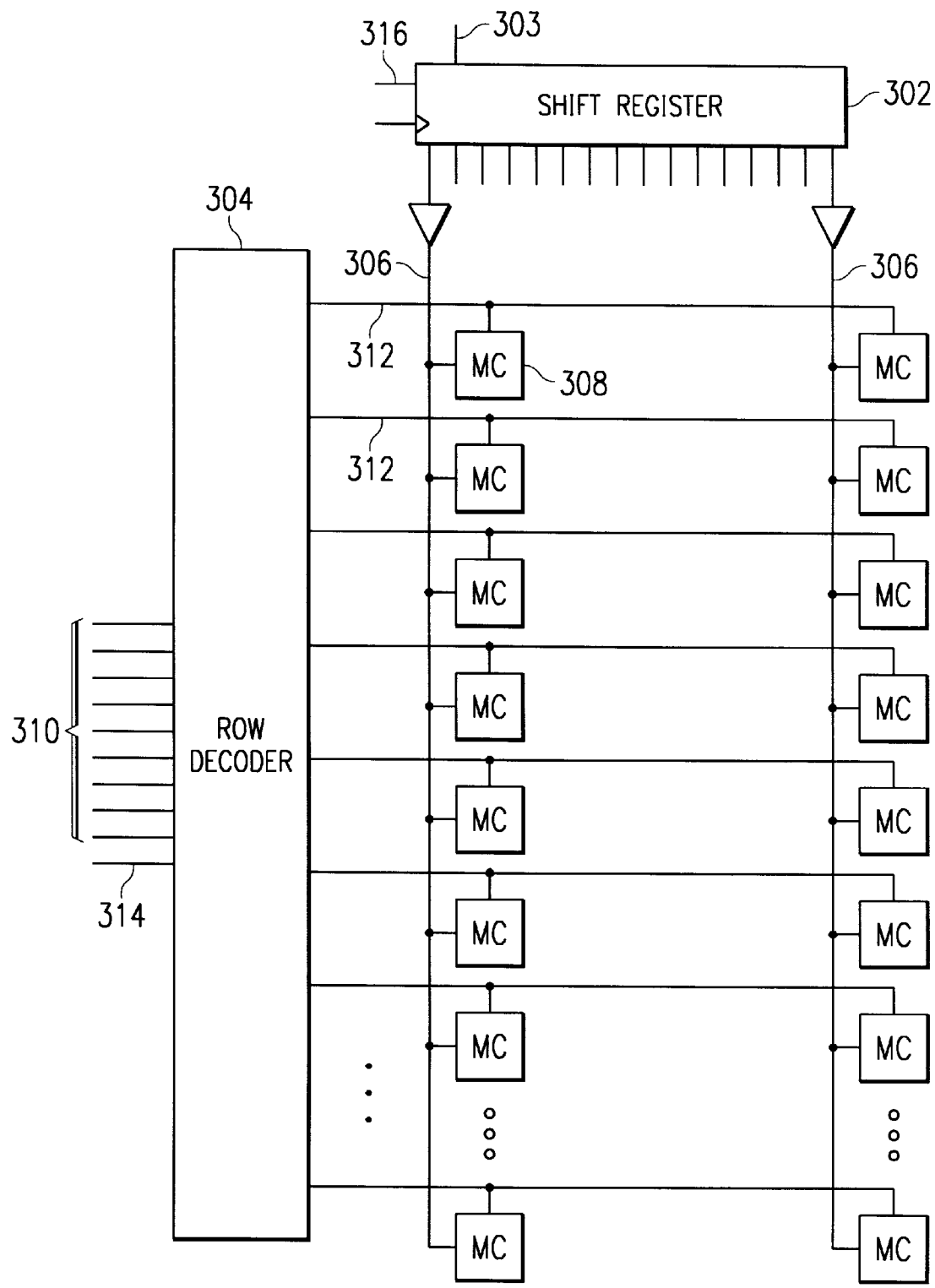
FIG. 3 is a schematic view of a portion of the address circuitry for a DMD array of the prior art.

Multiple data paths onto the DMD help to lower the per-pin data rate onto the DMD. Each path into the DMD provides data for a 16 pixel line segment. FIG. 3 shows a portion of the input circuitry and memory array fabricated under the micromirror array. In FIG. 3, shift register 302 receives serial pixel data via input 303 from a data formatter external to the DMD. Sixteen bits of image data are serially clocked into the shift register 302. After all sixteen bits are loaded in the shift register 302, a write enable signal from a row decoder 304 loads the data present on the bitlines 306 into the desired memory cells 308. Row decoder 304 typically selects one row of the array of memory cells 308. The row of memory cells drives a portion of the array of mirror elements.

To write an entire frame of data into a 1024×768 micromirror array requires many write operations. Sixteen sixty-four-bit wide data words are clocked into an array of sixty-four shift registers 302. Each of the shift registers receives the same bit from each of the sixteen data words. After all sixteen words have been written into the shift register array, the shift register array holds 1024 bits of data, enough for an entire line of the image being created. The entire line of image data is then latched into the memory cell array in a single write cycle. The particular row is determined by a data word provided to the row select input 310 of the row decoder. The process is repeated for each of the 768 rows in the micromirror array.

As mentioned above, often it is desired to quickly fill the array, or a portion of the array, with mirror off data. Shift register 302 and row decoder 304 include inputs to enable the memory array to be cleared quickly. Input 316 sets all of the bitlines 306 from the shift register 302 to a mirror off data signal, and input 314 to the row decoder selects thirty-two wordlines 312 from the row decoder 304. Thus, the entire array is cleared in only twenty-four write cycles, one for each of the twenty-four groups of 32 rows in the 768-row array.

The 768 row device is logically divided into 8 reset groups. Each reset group includes 96 rows of mirror elements that follow the same bit-splitting pulse width modulation sequence. Within each reset group, the write operation is typically limited to 32 rows since writing to more than 32 rows creates a large current spike in the micromirror device. Thus, a block clear operation, which is often limited to a particular reset group, is performed in three write operations.

It should be understood that the illustration of the row decode function as a 32-bit row decoder 304, as shown in FIG. 3, is for purposes of illustration and not for purposes of limitation. The row decoder can be a single logic circuit able to select individual rows or groups of rows throughout the memory cell array, or any other embodiment performing the row selection function. For example, the row decoder 304 could be implemented by several distinct row decoders selecting reset groups (96 rows according to this example), block clear groups (32 rows according to this example), and individual rows, or it could be implemented as separate decoders for the various row-by-row and block clear write operations.

Figure 4:
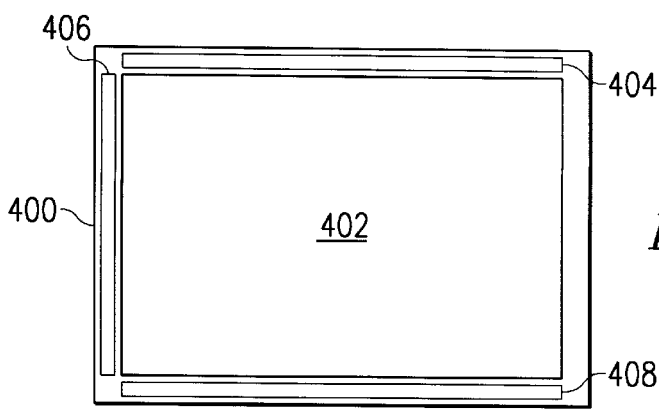
FIG. 4 is a plan view of a DMD substrate schematically showing the location on the DMD substrate of the address circuitry shown in FIG. 3.

FIG. 4 shows the physical location of various component of the address circuitry on the DMD substrate 400. The bulk of the substrate's surface is occupied by the memory cell array 402 that is formed under the micromirror array. One memory cell is formed under each micromirror to provide address data to the address electrodes underneath the micromirror. The input shift registers occupy region 404 on a first side of the memory cell array 402. The row decoders occupy region 406 on another side of the memory cell array 402. Each bitline runs the entire length of the memory cell array 402 from the first side where the bitlines are driven by the shift register array 404 to the bottom row of the memory cell array 402.

Figure 5:
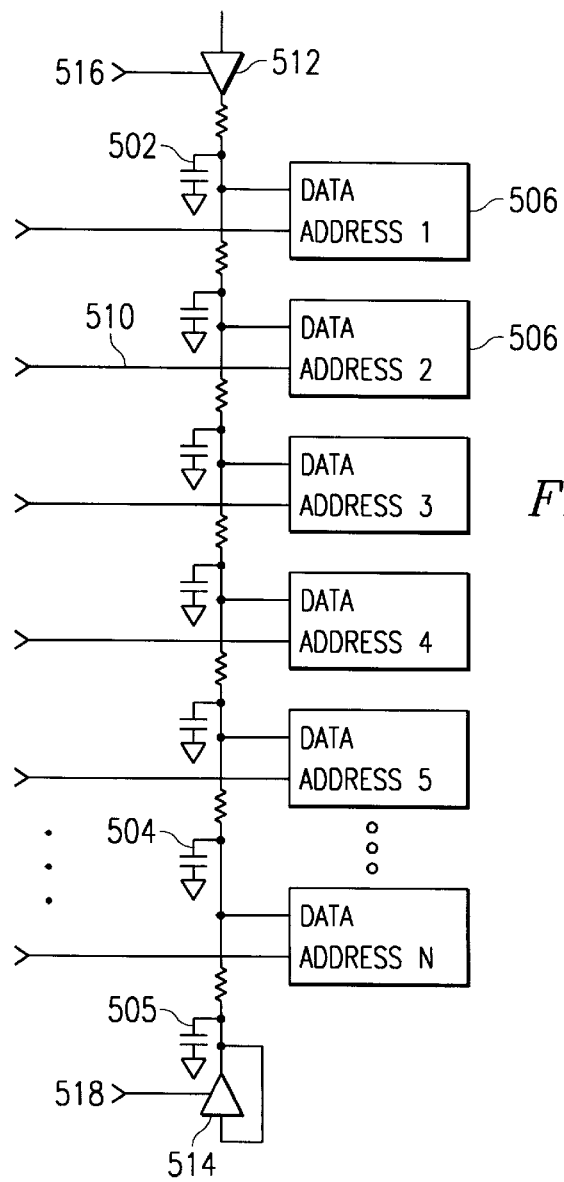
FIG. 5 is a schematic view of a portion of a DMD address circuit similar to that shown in FIG. 3 with a bitline feedback driver according to one embodiment of the present invention.

FIG. 5 is a schematic view of one column of memory cells in the memory cell array 402 according to one embodiment of the present invention. As mentioned above, each bitline 502 is a long signal trace that must traverse the entire memory cell array. The long bitline 502 has a relatively large distributed parasitic RC, shown in FIG. 5 by parasitic RC 504.

All of the memory cells 506 in the column are driven by output driver 512 via bitline 502. The memory cells are typically static random access memory (SRAM) cells. When driven, memory cell 506 in the memory cell array provides a resistive path from the bitline RC to a power supply when the memory cell is written to.

When a row of image data is written to the memory cell array a word-line 510 is driven active. The active word line 510 determines which memory cell in the column of memory cells the data will be written into. The bitline sources or sinks current as necessary to store the image data on the bitline in the memory cell 506. Although the bitline 502 and memory cell provide a significant load on the bitline, the output driver 512 can drive the bitline to store data in a single memory cell. 506

During a block-write operation, however, the output of the output driver 512 has difficulty driving the capacitance of the bitline 502 in addition to the capacitive and resistive loads presented by each of the thirty-two memory cells enabled by the row decoder. A larger output driver typically cannot be used to drive the bitline since room on the side of the array where the shift registers are located is not available. Also, in the five-transistor configuration, the RC time constant of the bitline is too large to allow a single bitline driver to overwrite multiple rows of memory cells.

A new memory array address circuit has been developed that enables the bitline to be driven by the output driver 512 of the shift register. Represented functionally in FIG. 5, the new address circuit includes a tristateable auxiliary driver 514, or feedback driver, that can source or sink the necessary bitline current. When the tristateable auxiliary driver 514 is in a high-impedance output state, the auxiliary driver 514 senses the image data present on the bitline 502. When enabled, the auxiliary driver 514 helps the output driver 512 source or sink current as required to drive whatever loads are present on the bitline. This feedback driver enables the bitline to be driven from both ends without data being present on both ends. This cuts the RC time constant of the bitline in half without sacrificing space and requiring additional input signals.

Figure 6:
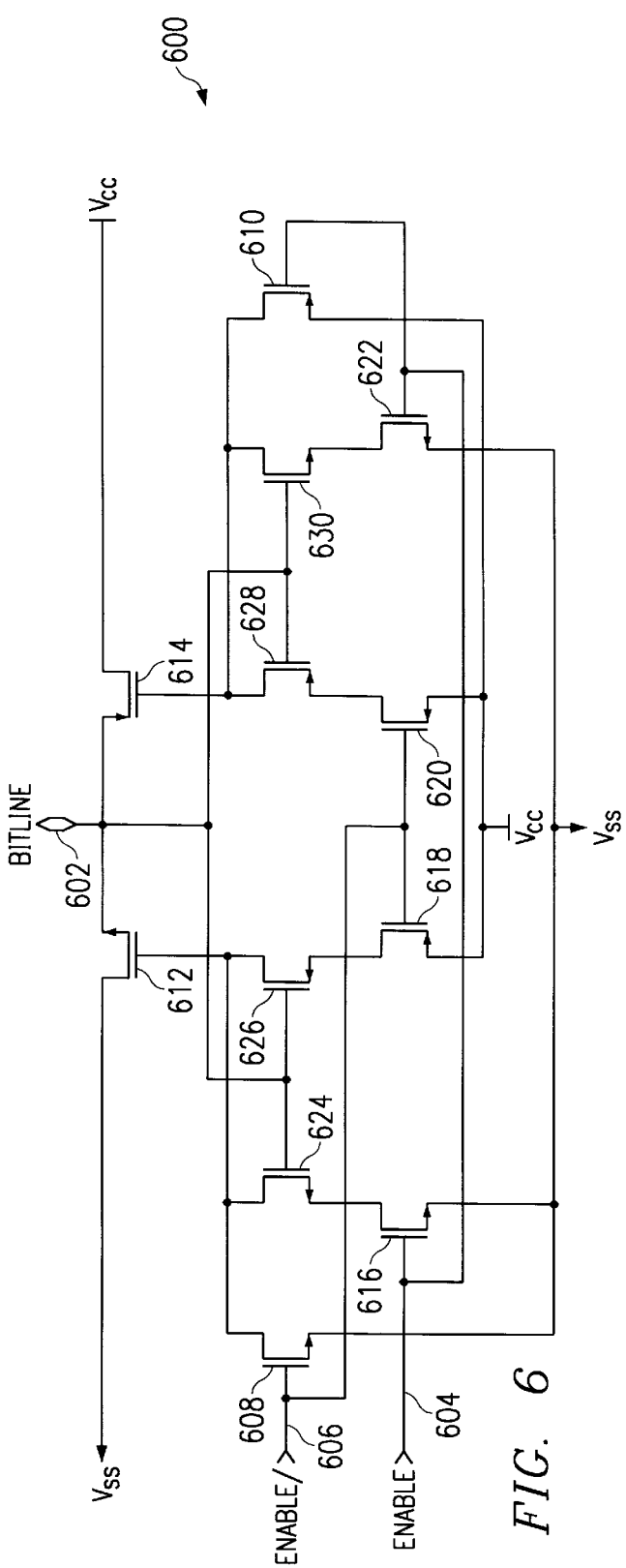
FIG. 6 is a schematic view of one embodiment of a bitline feedback driver shown in FIG. 5.

FIG. 6 is a schematic view of one embodiment of an auxiliary driver 600 shown in FIG. 5. Inputs to the auxiliary driver 600 include the bitline signal 602, an active-high enable signal 604 (ENABLE), a complementary active-low enable signal 606 (ENABLE/), a high supply voltage ($V_{cc}$), and a low supply voltage ($V_{ss}$). When the ENABLE and ENABLE/ are inactive, transistors 608 and 610 are turned on to provide $V_{ss}$ to the gate of transistor 612 and $V_{cc}$ to the gate of transistor 614. The application of these supply voltages turns off transistors 614 and 616, putting the output of the auxiliary driver in a high-impedance state. Transistors 616, 618, 620, and 622 are also turned off when the auxiliary driver 600 is disabled. Because transistors 616, 618, 620, and 622 are all turned off, no current can flow through transistors 624, 626, 628, and 630, to attempt to turn on output transistors 612 and 614.

When the auxiliary driver 600 is enabled, that is when ENABLE and ENABLE/ are both active, one of the output transistors 612, 614, turns on to drive the bitline. Which of the output transistors 612, 614 turns on depends on the status of the bitline at the time the auxiliary driver 600 is enabled. If the bitline 602 is being driven high before the auxiliary driver 600 is enabled, transistors 624 and 630 are turned on. When the auxiliary driver 600 is enabled, transistors 616 and 622 are turned on, allowing transistors 624 and 630 to drive the gates of the output transistors low. Driving the gates of the output transistors 612 and 614 low causes output transistor 612 to turn off and output transistor 614 to turn on—driving the bitline high.

Conversely, if the bitline 602 is being driven low before the auxiliary driver 600 is enabled, transistors 626 and 628 are turned on. When the auxiliary driver 600 is enabled, transistors 618 and 620 are turned on, allowing transistors 626 and 628 to drive the gates of the output transistors high. Driving the gates of the output transistors 612 and 614 high causes output transistor 612 to turn on and output transistor 614 to turn off—driving the bitline low.

Referring back to FIG. 4, the auxiliary drivers, one for each of the 1024 columns in memory array 402, are formed in region 408, at the opposite side of the memory array 402 from the input circuitry 404. Placing the auxiliary drivers on the opposite side of the substrate 400 from the input circuitry 404 only requires the enable signals to be routed around the perimeter of the substrate.

Figure 7:
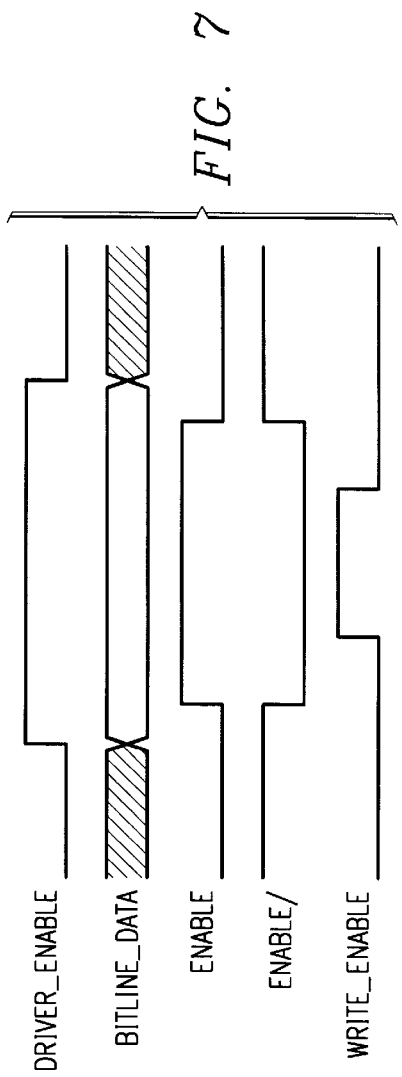
FIG. 7 is a timing diagram showing the relationship of the various timing signals used in FIGS. 5 and 6.

FIG. 7 is a timing diagram showing the relationship between the bitline enable signal 516 (DRIVER_ENABLE), the data on the bitline (BITLINE_DATA), the auxiliary driver enable signals (ENABLE and ENABLE/), and the write line signal 510 (WRITE_ENABLE). As shown in FIG. 7, the bitline enable signal is active first, followed by the auxiliary driver enable signals and finally the write enable signal. If the data signal on the bitline is only being written to a single memory cell, or to few enough memory cells that the auxiliary bitline driver current is not required, it is not necessary to enable the auxiliary driver. Thus, a simple write sequence may be used when writing image data to a single row of the memory array, and a more complex and possibly longer write sequence when performing a block clear. The signals are inactivated in reverse order: first the write enable, then the auxiliary driver enables, and finally the bitline enable.

Figure 8:
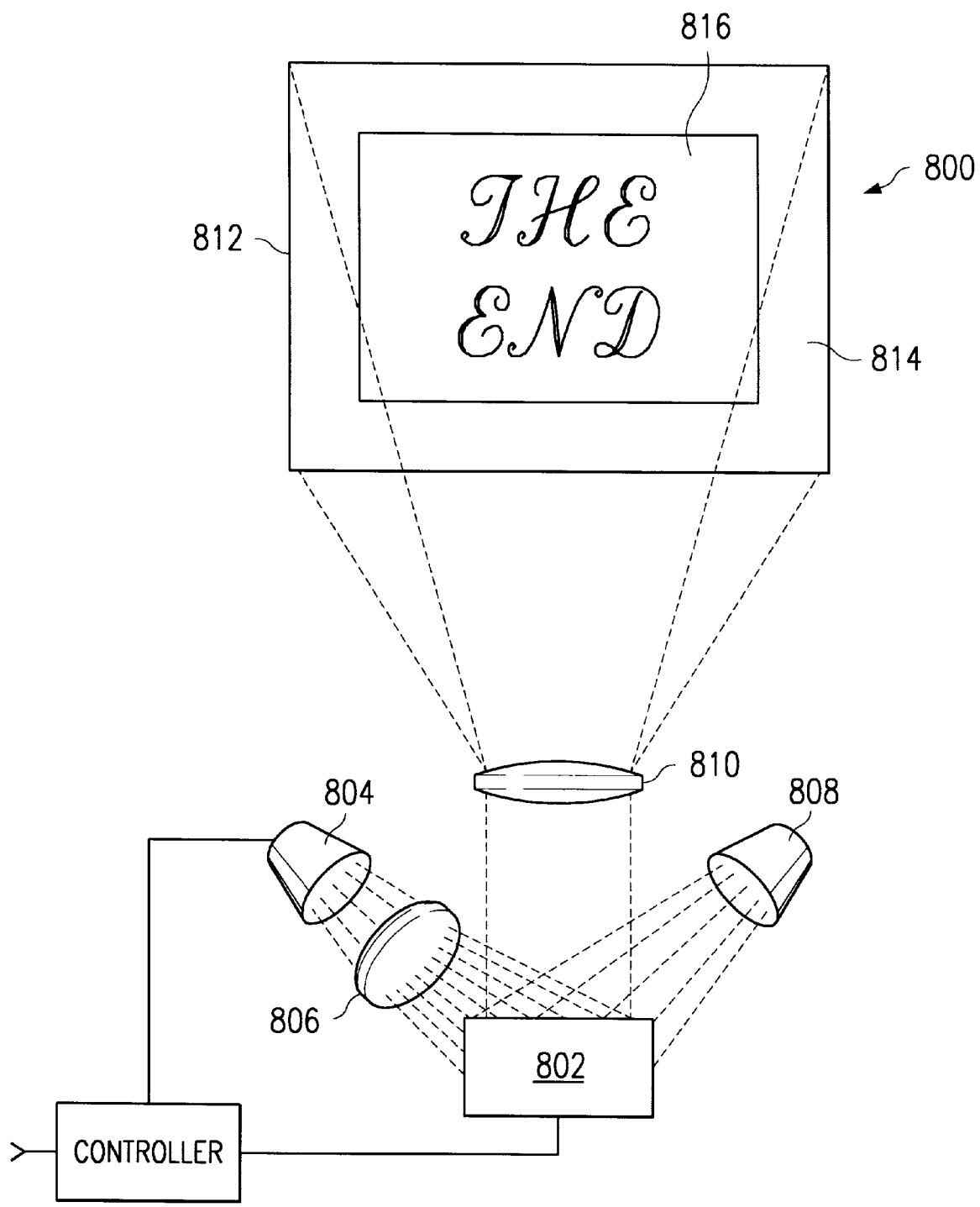
FIG. 8 is a schematic view of a display system using a micromirror device having the bitline feedback driver of FIGS. 5 and 6.

FIG. 8 is a schematic view of an image projection system 800 using an improved micromirror 802 according to the present invention. In FIG. 8, light from light source 804 is focused on the improved micromirror 802 by lens 806. Although shown as a single lens, lens 806 is typically a group of lenses and mirrors which together focus and direct light from the light source 804 onto the surface of the micromirror device 802. Image data and control signals from controller 814 cause some mirrors to rotate to an on position and others to rotate to an off position. Mirrors on the micromirror device that are rotated to an off position reflect light to a light trap 808 while mirrors rotated to an on position reflect light to projection lens 810, which is shown as a single lens for simplicity. Projection lens 810 focuses the light modulated by the micromirror device 802 onto an image plane or screen 812.

Although the description thus far has focused on the application of the auxiliary driver in a memory array, it should be understood that the teachings herein are capable of much broader application. For example, the concepts herein may be applied to many circumstances where additional driver current is needed to assist a line driver in driving a large load. The novel concepts herein are especially applicable when the large load is intermittently driven, or when it is desired to supply the auxiliary drive current from a remote portion of the circuit—for example when the bitline or other conductive path being driven is relatively long, or when space, power, or thermal restrictions limit the size or capacity of the line driver.

Thus, although there has been disclosed to this point a particular embodiment for bitline feedback in a memory array, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A memory circuit comprising micromirror device comprising:
   an array of memory cells;
   at least one bitline electrically connected to at least one of said memory cells;
   at least one bitline driver electrically connected to said at least one bitline, said bitline driver for driving a data signal on said bitline connected thereto; and
   at least one auxiliary bitline driver electrically connected to said bitline, said auxiliary bitline driver able to sense said data signal and to drive said data signal on said bitline.

2. The memory circuit of claim 1, further comprising a row selector for causing a write operation in at least one said memory cell.

3. The memory circuit of claim 1, said bitline comprising an electrically conductive signal path connected by a middle portion to at least two said memory cells, by a first end portion to said bitline driver, and by a second end portion to said auxiliary driver.

4. The memory circuit of claim 1, said auxiliary driver comprising a tristateable driver circuit, said tristateable driver circuit having an input electrically connected to said bitline and an output electrically connected to said bitline.

5. A line driver circuit comprising:

a load circuit;

a conductive signal path electrically connected to said load circuit;

a line driver electrically connected to said conductive signal path, said line driver for driving a signal on said conductive signal path; and an auxiliary line driver electrically connected to said conductive path, said auxiliary line driver able to sense said signal and to drive said signal on said conductive path.

6. The line driver circuit of claim 5, further comprising a selector for enabling said load circuit.

7. The line driver circuit of claim 5, said conductive signal path connected by a middle portion to at least two said load circuits, by a first end portion to said line driver, and by a second end portion to said auxiliary line driver.

8. The line driver circuit of claim 5, said auxiliary line driver comprising a tristateable driver circuit, said tristateable driver circuit having an input electrically connected to said conductive signal path and an output electrically connected to said conductive signal path.

9. A method of writing to a memory array, said method comprising the steps of:

driving a data signal on a bitline to a portion of said memory array with a bitline driver;

sensing said data signal at a location remote to said bitline driver;

driving said sensed data signal on said bitline with an auxiliary bitline driver.

10. The method of claim 9, further comprising the step of storing said data signal in at least one memory cell in said memory array.

11. The method of claim 9, said step of driving said data signal on said bitline comprises the step of enabling a first bitline driver.

12. The method of claim 9, said step of sensing said data signal at a location remote to said bitline driver comprising the step of providing said data signal to an input of said auxiliary bitline driver.

13. The method of claim 9, said step of driving said sensed data signal on said bitline with an auxiliary bitline driver comprising the step of enabling an output of said auxiliary bitline driver.

\* \* \* \* \*